(12) United States Patent
Litman et al.

(10) Patent No.: US 10,714,305 B2
(45) Date of Patent: Jul. 14, 2020

(54) RETRACTABLE DETECTOR

(71) Applicant: APPLIED MATERIALS ISRAEL LTD., Rehovot (IL)

(72) Inventors: Alon Litman, Nes-Ziona (IL); Efim Vinnitsky, Ashkelon (IL)

(73) Assignee: Applied Materials Israel Ltd., Rehovot (IL)

( * ) Notice: Subject to any disclaimer, the term of this patent is extended or adjusted under 35 U.S.C. 154(b) by 0 days.

(21) Appl. No.: 16/279,538

(22) Filed: Feb. 19, 2019

(65) Prior Publication Data

US 2019/0189391 A1     Jun. 20, 2019

Related U.S. Application Data

(63) Continuation of application No. 15/703,925, filed on Sep. 13, 2017, now Pat. No. 10,211,026, which is a (Continued)

(51) Int. Cl.
    *H01J 37/20*   (2006.01)
    *H01J 37/28*   (2006.01)
    (Continued)

(52) U.S. Cl.
    CPC ............ *H01J 37/244* (2013.01); *H01J 37/20* (2013.01); *H01J 37/28* (2013.01); *H01J 37/285* (2013.01);
    (Continued)

(58) Field of Classification Search
    CPC .......... H01J 37/20; H01J 37/244; H01J 37/28; H01J 37/285; H01J 2237/2445;
    (Continued)

(56) References Cited

U.S. PATENT DOCUMENTS 5,214,282 A   5/1993 Yamaguchi et al.
5,500,528 A   3/1996 Matsui et al.
(Continued)

OTHER PUBLICATIONS

U.S. Appl. No. 15/414,517 Corrected Notice of Allowability dated Aug. 16, 2018, 2 pages.
(Continued)

*Primary Examiner* — David A Vanore
(74) *Attorney, Agent, or Firm* — Kilpatrick Townsend & Stockton LLP (57) ABSTRACT

A method for evaluating a specimen, the method can include positioning an energy dispersive X-ray (EDX) detector at a first position; scanning a flat surface of the specimen by a charged particle beam that exits from a charged particle beam optics tip and propagates through an aperture of an EDX detector tip; detecting, by the EDX detector, x-ray photons emitted from the flat surface as a result of the scanning of the flat surface with the charged particle beam; after a completion of the scanning of the flat surface, positioning the EDX detector at a second position in which a distance between the EDX detector tip and a plane of the flat surface exceeds a distance between the plane of the flat surface and the charged particle beam optics tip; and wherein a projection of the EDX detector on the plane of the flat surface virtually falls on the flat surface when the EDX detector is positioned at the first position and when the EDX detector is positioned at the second position.

20 Claims, 9 Drawing Sheets

Related U.S. Application Data continuation of application No. 15/005,949, filed on Jan. 25, 2016, now Pat. No. 9,818,577.

(51) Int. Cl.
  *H01J 37/244* (2006.01)
  *H01J 37/285* (2006.01)
(52) U.S. Cl.
  CPC . *H01J 2237/024* (2013.01); *H01J 2237/2445* (2013.01); *H01J 2237/2807* (2013.01)
(58) Field of Classification Search
  CPC ......... H01J 2237/2807; H01J 2237/024; H01J 2237/24475; H01J 2237/2448; H01J 2237/24592; G01Q 30/02; G01Q 60/22
  USPC ...... 250/306, 307, 492.1, 492.2; 850/16, 18, 850/22, 26, 49, 52, 57
  See application file for complete search history.

(56) References Cited

U.S. PATENT DOCUMENTS

| | | | |
|---|---|---|---|
| 6,852,982 B1 | 2/2005 | Bierhoff et al. | |
| 9,315,663 B2 | 4/2016 | Appleby et al. | |
| 9,805,909 B1 | 10/2017 | Shemesh et al. | |
| 9,818,577 B2 * | 11/2017 | Litman | H01J 37/285 |
| 10,074,513 B2 | 9/2018 | Litman et al. | |
| 10,211,026 B2 | 2/2019 | Litman et al. | |
| 2002/0079463 A1 | 6/2002 | Shichi et al. | |
| 2002/0100877 A1 | 8/2002 | Ochiai et al. | |
| 2009/0114818 A1 | 5/2009 | Casares et al. | |
| 2012/0132818 A1 | 5/2012 | Meiken et al. | |
| 2012/0160999 A1 | 6/2012 | Zaluzec et al. | |
| 2012/0326032 A1 | 12/2012 | Benner et al. | |
| 2015/0235726 A1 | 8/2015 | Satoshi et al. | |
| 2017/0213696 A1 | 7/2017 | Litman et al. | |
| 2017/0213697 A1 | 7/2017 | Litman | |
| 2018/0012728 A1 | 1/2018 | Litman et al. | |

OTHER PUBLICATIONS

U.S. Appl. No. 15/414,517 Corrected Notice of Allowability dated Jul. 16, 2018, 2 pages.
U.S. Appl. No. 15/414,517 Notice of Allowance dated Apr. 20, 2018, 10 pages.
U.S. Appl. No. 15/414,517 First Action Interview Pilot Program Pre-Interview Communication dated Nov. 29, 2017, 5 pages.
U.S. Appl. No. 15/005,949 Non-Final Office Action dated Jan. 6, 2017, 13 pages.
U.S. Appl. No. 15/005,949 Notice of Allowance dated Jul. 5, 2017, 10 pages.
U.S. Appl. No. 15/703,925 Non-Final Office Action dated Jun. 26, 2018, 12 pages.
U.S. Appl. No. 15/703,925 Notice of Allowance dated Sep. 28, 2018, 7 pages.

* cited by examiner

RETRACTABLE DETECTOR

CROSS REFERENCE TO RELATED APPLICATIONS

The present application is a continuation of U.S. application Ser. No. 15/703,925, filed Sep. 13, 2017, which is a continuation of U.S. application Ser No. 15/005,949, filed Jan. 25, 2016, now U.S. Pat. No. 9,818,577, the entire contents of which are incorporated herein by reference in their entirety for all purposes.

BACKGROUND

An energy dispersion x-ray detector (EDX) can be used for determining a composition of a microscopic element. An energy dispersion x-ray detector collects x-ray photons emitted as a result of an illumination of the microscopic element and generates an energy spectrum. Energy spectrum means any type of information about energy levels at different wavelengths or frequencies along the spectrum. For example—the energy spectrum can be a histogram that displays the number of X-ray counts for each x-ray energy level. Measuring X ray energies can help to characterize the element from which an x-ray photon was emitted.

The column that illuminates the microscopic element is proximate to the element and has a relatively big tip. The big tip prevents the EDX detector from being positioned in proximity of the microscopic element and may also force the EDX detector to be positioned in an asymmetrical manner in relation to the axis of illumination thereby providing a partial and asymmetrical angular coverage.

There is a growing need to improve the accuracy of EDX measurements.

SUMMARY

According to an embodiment of the invention a method for evaluating a specimen is provided. The method can include positioning an energy dispersive X-ray (EDX) detector at a first position; scanning a flat surface of the specimen by a charged particle beam that exits from a charged particle beam optics tip and propagates through an aperture of an EDX detector tip; detecting, by the EDX detector, x-ray photons emitted from the flat surface as a result of the scanning of the flat surface with the charged particle beam; after a completion of the scanning of the flat surface, positioning the EDX detector at a second position in which a distance between the EDX detector tip and a plane of the flat surface exceeds a distance between the plane of the flat surface and the charged particle beam optics tip; and wherein a projection of the EDX detector on the plane of the flat surface virtually falls on the flat surface when the EDX detector can be positioned at the first position and when the EDX detector can be positioned at the second position.

The method can include processing detection signals generated by the EDX detector to provide estimated compositions of multiple points of the flat surface of the specimen.

The positioning of the EDX detector at the second position can include moving the EDX detector along a first direction that can be parallel to the flat surface of the specimen and along a second direction that can be vertical to the flat surface of the specimen.

According to an embodiment of the invention there can be provided a charged particle beam system that can include (i) a controller, (ii) a movable stage that can be configured to support a specimen; (iii) charged particle beam optics that can include a charged particle beam optics tip that can be configured to output a primary charged particle beam; (iv) an electron detector; (v) an energy dispersive X-ray (EDX) detector; and (vi) an EDX detector motion module. The EDX detector can include an EDX detector tip that can include an aperture and a window. The EDX detector motion module can be configured to move the EDX detector between a first position and a second position. The EDX detector tip can be positioned between the charged particle beam optics tip and a flat surface of the specimen and the charged particle beam passes through the aperture when the EDX detector can be positioned at the first position and the movable stage supports the specimen. A distance between the EDX detector tip and the movable stage exceeds a distance between the movable stage and the charged particle beam optics tip when the EDX detector can be positioned at the second position. A projection of the EDX detector on a plane of the flat surface virtually falls on the flat surface when the EDX detector can be positioned at the first position and when the EDX detector can be positioned at the second position.

The movable stage can be configured to follow a mechanical scan pattern and the charged particle beam optics can be configured to deflect the charged particle beam thereby scanning the flat surface of the specimen; and wherein x-ray photons emitted as a result of the scanning of the specimen enter the window of the EDX detector tip and are detected by an x-ray sensitive element of the EDX detector.

The system can include a processor that can be configured to associate between points of the flat surface of the specimen that were illuminated during the scanning of the flat surface of the specimen and detection signals generated by the EDX detector.

The processor can be configured to evaluate compositions of the points of the flat surface of the specimen that were illuminated during the scanning of the specimen.

The EDX detector can include multiple windows that are positioned at a radial symmetry.

The EDX detector motion module can be configured to move the EDX detector from the second position to the first position by moving downwards and towards the charged particle optics tip a portion of the EDX detector.

The EDX detector can include an EDX detector amplifier and a EDX detector conduit; and wherein the EDX detector conduit surrounds an EDX detector conductor that can be coupled between a x-ray sensitive element of the EDX detector and the EDX detector amplifier.

The system can include a specimen chamber; wherein the specimen chamber can include a chamber opening through which the EDX detector conduit passes; wherein the chamber opening can be sealed by a bellows; and wherein the bellows surrounds the EDX conduit.

The EDX conduit can include an upper horizontal portion, a lower horizontal portion and a sloped intermediate portion that can be connected between the upper horizontal portion and the lower horizontal portion.

The lower horizontal portion can be connected to the EDX detector tip.

The EDX detector amplifier can be positioned outside a specimen chamber and the EDX detector tip remains within the specimen chamber when the EDX detector can be positioned at the first position and when the EDX detector can be positioned at the second position.

BRIEF DESCRIPTION OF THE DRAWINGS

The subject matter regarded as the invention is particularly pointed out and distinctly claimed in the concluding portion of the specification. The invention, however, both as to organization and method of operation, together with specimen s, features, and advantages thereof, can best be understood by reference to the following detailed description when read with the accompanying drawings in which:

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention can be practiced without these specific details. In other instances, well-known methods, procedures, and components have not been described in detail so as not to obscure the present invention.

Because the illustrated embodiments of the present invention can for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a system capable of executing the method.

Any reference in the specification to a system should be applied mutatis mutandis to a method that can be executed by the system.

Figure 1:
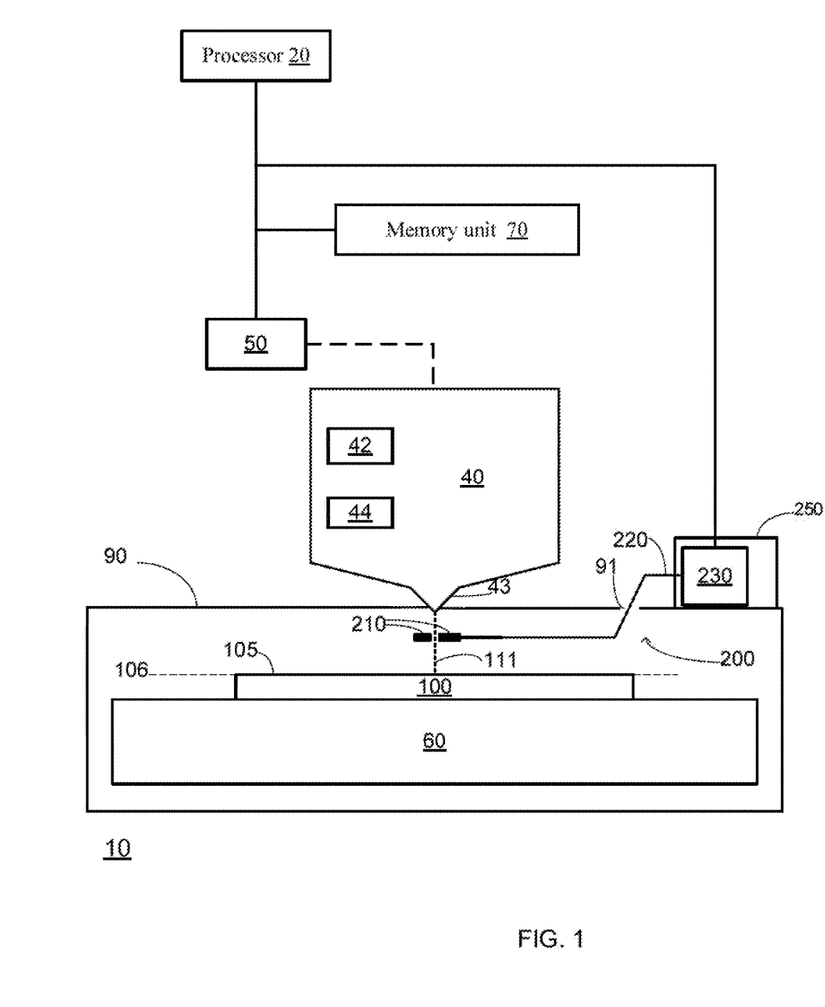
FIG. 1 illustrates a specimen and a charged particle beam system according to an embodiment of the invention.

FIG. 1 illustrates charged particle beam system 10 and specimen 100 according to an embodiment of the invention.

The specimen 100 has a flat surface 105 that is scanned by the charged particle beam, system 10. Flat surface 105 is located within an imaginary plane 106 that is referred to as the plane of the flat surface. The flat surface 105 is flat in the sense that there up to nanometric scale height differences between different points of the flat surface.

Charged particle beam system 10 is illustrated as being a charged particles imager such as but not limited to a scanning electron microscope (SEM) or an electron beam inspection system.

Charged particle beam system 10 includes controller 50, movable stage 60, charged particle beam optics 40, EDX detector 200, EDX detector motion module 250, specimen chamber 90, memory unit 70 and processor 20.

Controller 50 is configured to control the operation of at least some of the various components of charged particle beam system 10.

Movable stage 60 is configured to support specimen 100 and move specimen according to a mechanical scan pattern.

Charged particle beam optics 40 is configured to (a) generate a primary charged particle beam 111, (b) deflect and otherwise direct the primary charged particle beam 111 to exit through charged particle beam optics tip 43 to impinge on flat surface 105 of specimen 100, (c) detect electrons that are emitted from flat surface 105.

In FIG. 1 the charged particle beam optics 40 is illustrated as including in-lens secondary electron detector 42 and in-lens backscattered electron detector 44. It is noted that charged particle beam optics 40 can include one or more electron out-lens electron detector, can have only one or more secondary electron detector, can include only one or more backscattered electron detector or can include any combination of electron detectors.

EDX detector motion module 250 is configured to move the EDX detector 200 between a first position and a second position.

Specimen 100 can be a wafer, a micro-machined object, a solar panel and the like. Specimen 100 can be relatively large (for example—have a diameter of 300 millimeters) and EDX detector, even when positioned at the second position can be positioned directly above specimen 100.

Accordingly, the projection of the EDX detector 200 on plane 106 virtually falls on specimen 100 when the EDX detector 200 is positioned at the first position and when the EDX detector is positioned at the second position.

EDX detector 200 includes EDX detector tip 210, EDX detector conduit 220 and EDX detector amplifier 230. FIG. 1 illustrates EDX detector 200 as being positioned in a first position in which EDX detector tip 210 is positioned between charged particle beam optics tip 43 and specimen 100. Primary charged particle beam 111 passes through an aperture formed in EDX detector tip 210. EDX detector conduit 220 passes through a specimen chamber opening 91.

When EDX detector 200 is positioned at the first position EDX, detector tip 210 is very close (for example—few tenths of nanometers) to flat surface 105 and thus EDX detector 200 is able to detect x-ray photons that propagate within a large angular range that EDX detectors 200 that are more distant from flat surface 105.

Furthermore—when placing windows on both sides of the aperture—the EDX detector 200 can provide a symmetrical coverage of emitted x-ray photons.

Movable stage 60 can follow a mechanical scan pattern and charged particle beam optics 40 can deflect primary charged particle beam 111 thereby scanning flat surface 105.

X-ray photons emitted as a result of the scanning of flat surface 105 enter the window of EDX detector tip 210 and are detected by an x-ray sensitive element of the EDX detector. The x-ray sensitive element can be a photodiode. The x-ray sensitive element generates detection signals indicative of the detected x-ray photons. The detection signals are sent via EDX detector conduit 220 to EDX detector amplifier 230 and can then be stored in memory unit 70 or processed by processor 20. It is noted that the detection signals can be converted to digital detection signals by EDX detector amplifier 230 or by an analog to digital converter that does not belong to EDX detector amplifier 230.

Processor 20 can correlate or otherwise associate between points of the specimen that were illuminated (by primary charged particle beam 111) during the scanning of flat surface 105 and detection signals generated by the EDX detector.

Processor 20 can be configured to evaluate compositions of the points of the specimen that were illuminated during the scanning of the flat surface 105.

Figure 2:
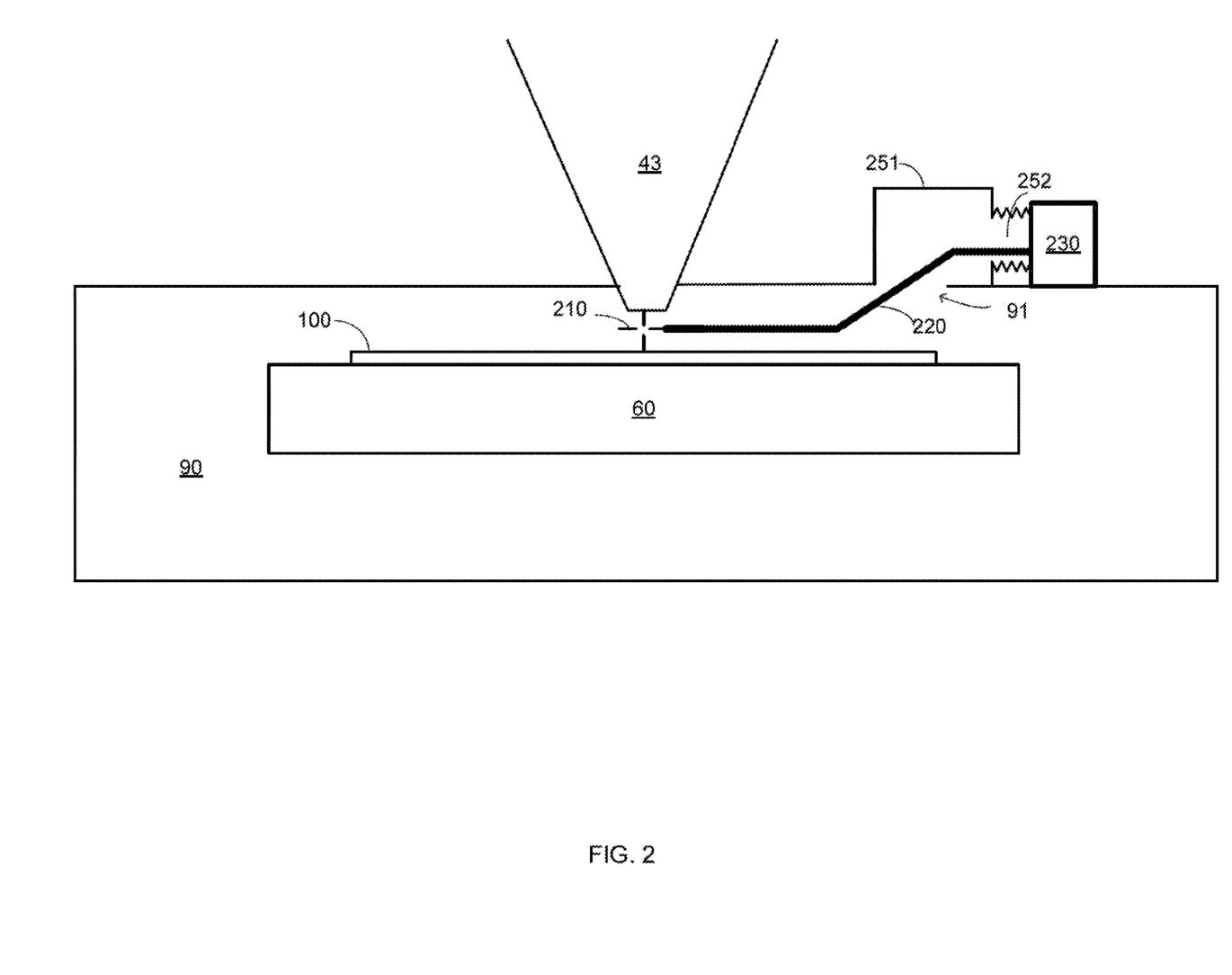
FIG. 2 is a cross sectional view of a charged particle beam system and a specimen according to an embodiment of the invention.

FIG. 2 is a cross sectional view of charged particle beam system 10 and specimen 100 according to an embodiment of the invention.

EDX detector amplifier 230 is positioned outside specimen chamber 90 and EDX detector tip 210 is positioned within specimen chamber 90—at least when EDX detector 200 is positioned at the first position.

EDX detector tip 210 is coupled to EDX detector amplifier 230 via EDX detector conduit 220. In FIG. 2 the EDX detector 200 is positioned at a first position and the primary charged particle beam passes through an aperture formed in EDX detector tip 210.

EDX detector conduit 220 passes through specimen chamber opening 91.

Specimen 100 is supported by movable stage 60.

In order to maintain very low specimen chamber pressure the specimen chamber 90 should be sealed regardless of the position of the EDX detector 200.

The sealing is obtained by including a cover 251 and bellows 252 that surround EDX detector conduit 220 and seal the EDX detector conduit 220 and the specimen chamber 90 from the environment.

Bellows 252 is flexible and is connected between EDX detector amplifier 230 and cover 251.

Figure 3:
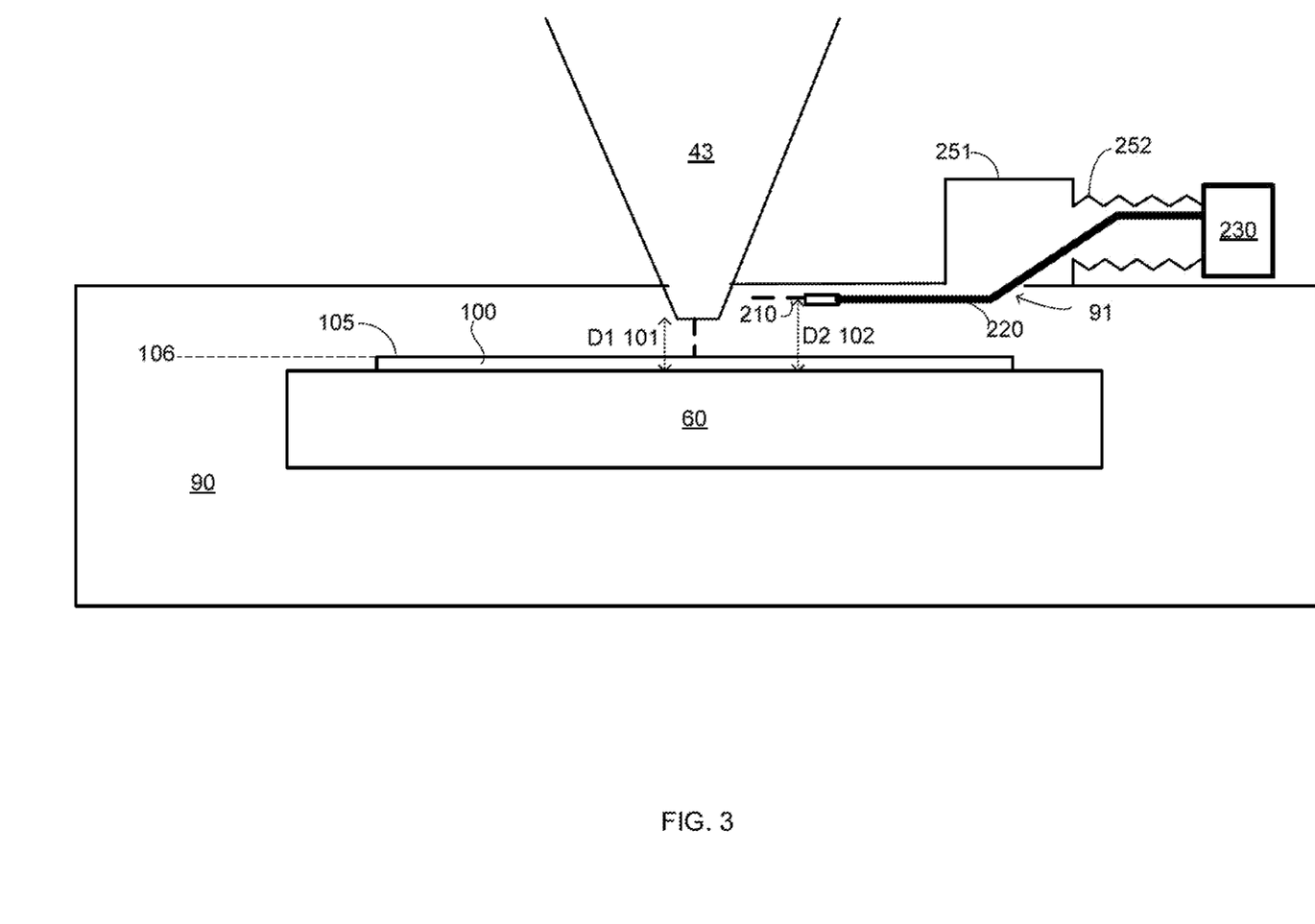
FIG. 3 is a cross sectional view of a charged particle beam system and a specimen according to an embodiment of the invention.

FIG. 3 is a cross sectional view of charged particle beam system 10 and specimen 100 according to an embodiment of the invention.

FIG. 3 illustrates EDX detector 200 as being positioned in a second position in which EDX detector tip 210 is spaced apart from the charged particle beam optics tip 43 and the specimen 100. EDX detector tip 210 does not interfere with any measurements performed by charged particle beam optics 40.

When in the second position the distance (D2 102) between EDX detector tip 210 and the movable stage 60 exceeds the distance (D1 101) between the movable stage and the charged particle beam optics tip 43 when the EDX detector is positioned at the second position.

The EDX detector 200 can be moved in various manners between the first and second positions. For example, EDX detector 200 can be moved towards the first position by a downwards and leftward movement.

Figure 4:
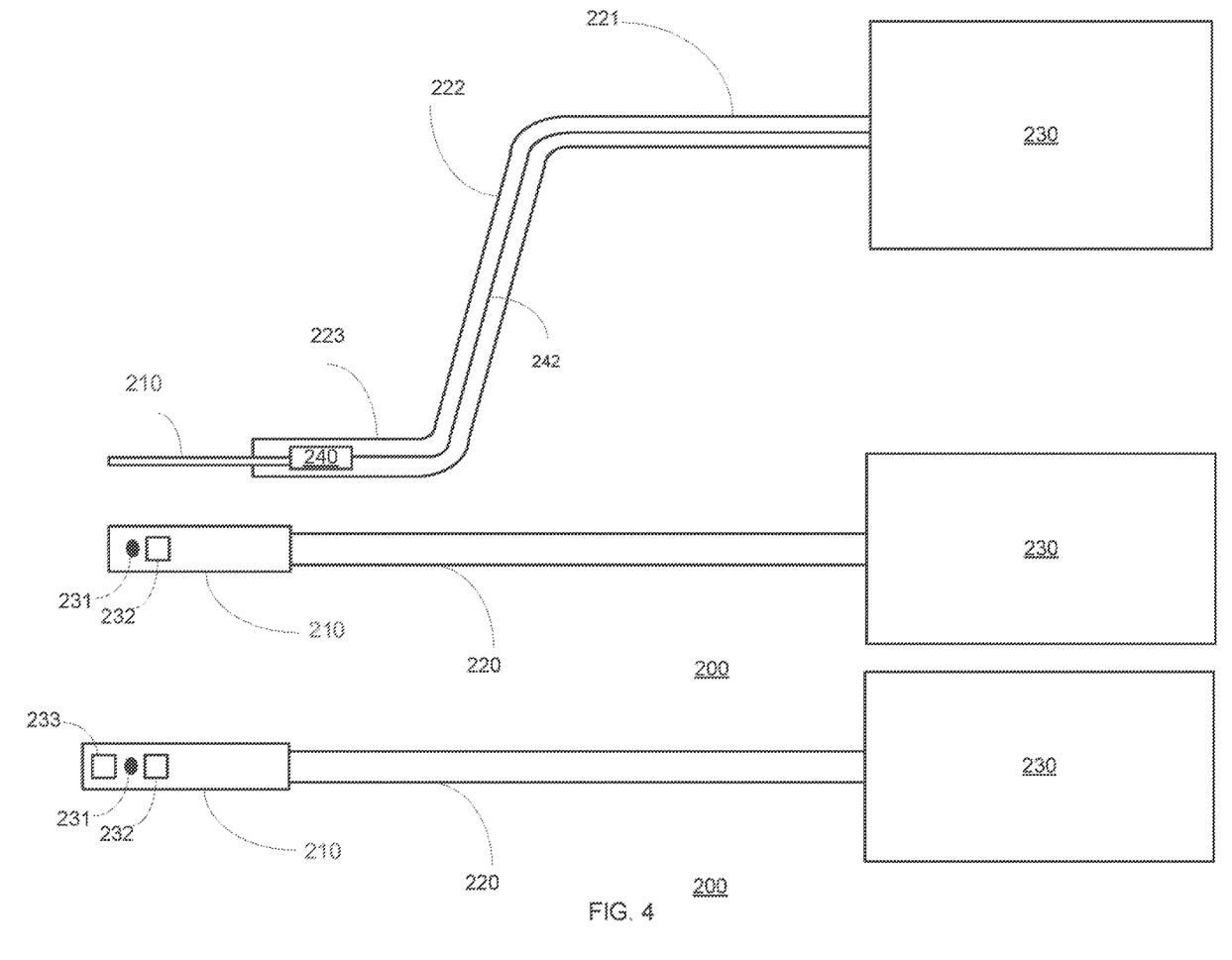
FIG. 4 includes a top view and a side view of a EDX detector according to an embodiment of the invention.

FIG. 4 includes a top view and a side view of EDX detector 200 according to an embodiment of the invention.

EDX detector tip 210 is coupled to EDX detector amplifier 230 via EDX detector conduit 220.

EDX detector tip 210 is illustrates as including aperture 231 and window 232. A primary charged particle beam can pass through aperture 231 when EDX detector 200 is at a first position. X-ray photons emitted from the specimen pass through window 232 and are detected by x-ray sensitive element 240 of EDX detector 200. The x-ray sensitive element 240 can be position within EDX detector tip 210 but this is not necessarily so.

X-ray sensitive element 240 generates detection signals that are sent, via conductor 242 to EDX detector amplifier 230.

EDX detector conduit 220 is illustrated as including upper horizontal portion 221, lower horizontal portion 223 and sloped intermediate portion 222 that is connected between the upper horizontal portion 221 and the lower horizontal portion 223.

EDX detector conduit 220 can be rigid or elastic. EDX detector conduit 220 may have any shape or size.

FIG. 4 also illustrates an alternative configuration of EDX detector tip 210—that includes multiple windows 232 and 233 that are arranged in a symmetrical manner on both sides of aperture 231.

Figure 5:
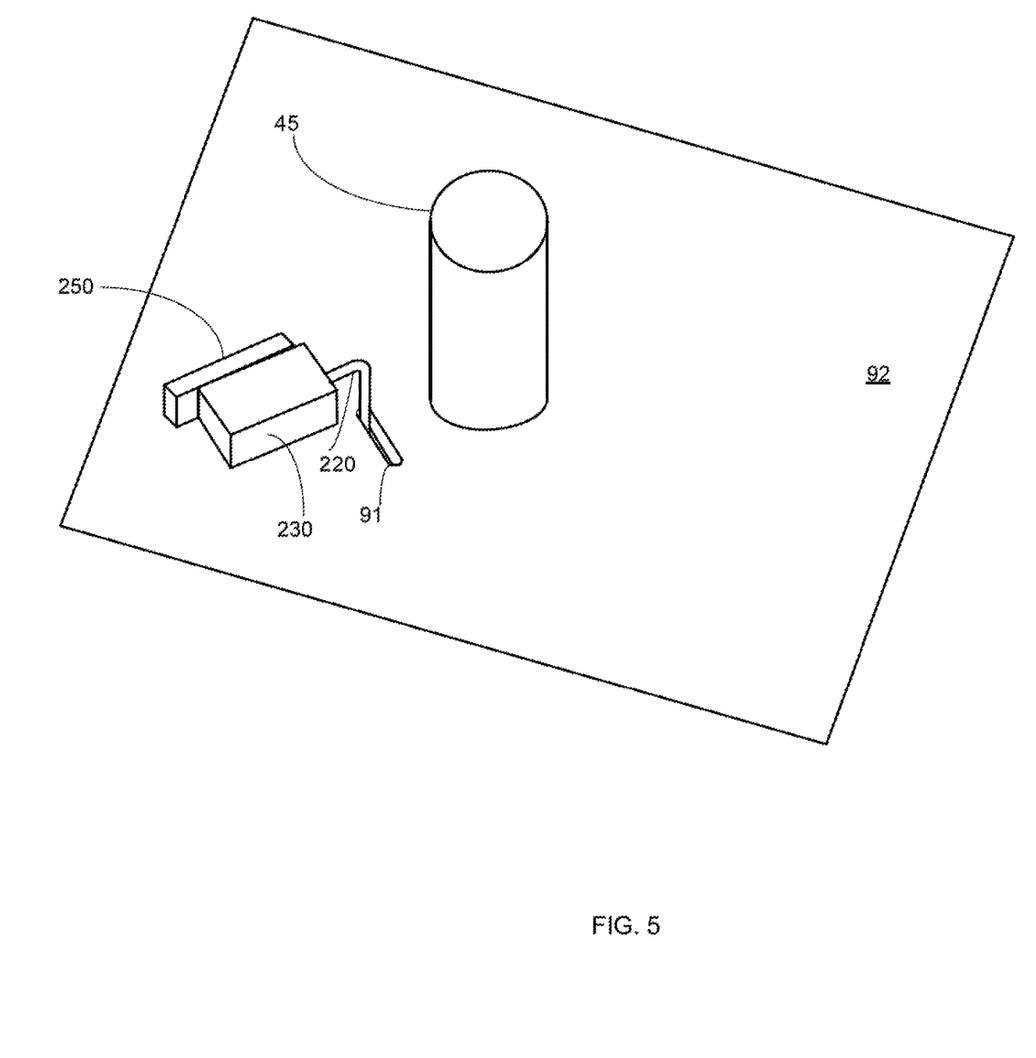
FIG. 5 illustrates an upper facet of a specimen chamber, an EDX detector motion module, an EDX detector amplifier, an EDX detector conduit, a specimen chamber opening and a column of charged particle beam optics according to an embodiment of the invention.

FIG. 5 illustrates an upper facet 92 of specimen chamber, EDX detector motion module 250, EDX detector amplifier 230, EDX detector conduit 220, specimen chamber opening 91 and a column 45 of charged particle beam optics 40 according to an embodiment of the invention.

In FIG. 5 the EDX detector 200 is in a first position. Cover 251 and bellows 252 are not shown for simplicity of explanation.

EDX detector motion module 250 contacts the EDX detector amplifier 230 and moves EDX detector amplifier 230 in order to change the position of EDX detector 200.

Figure 6:
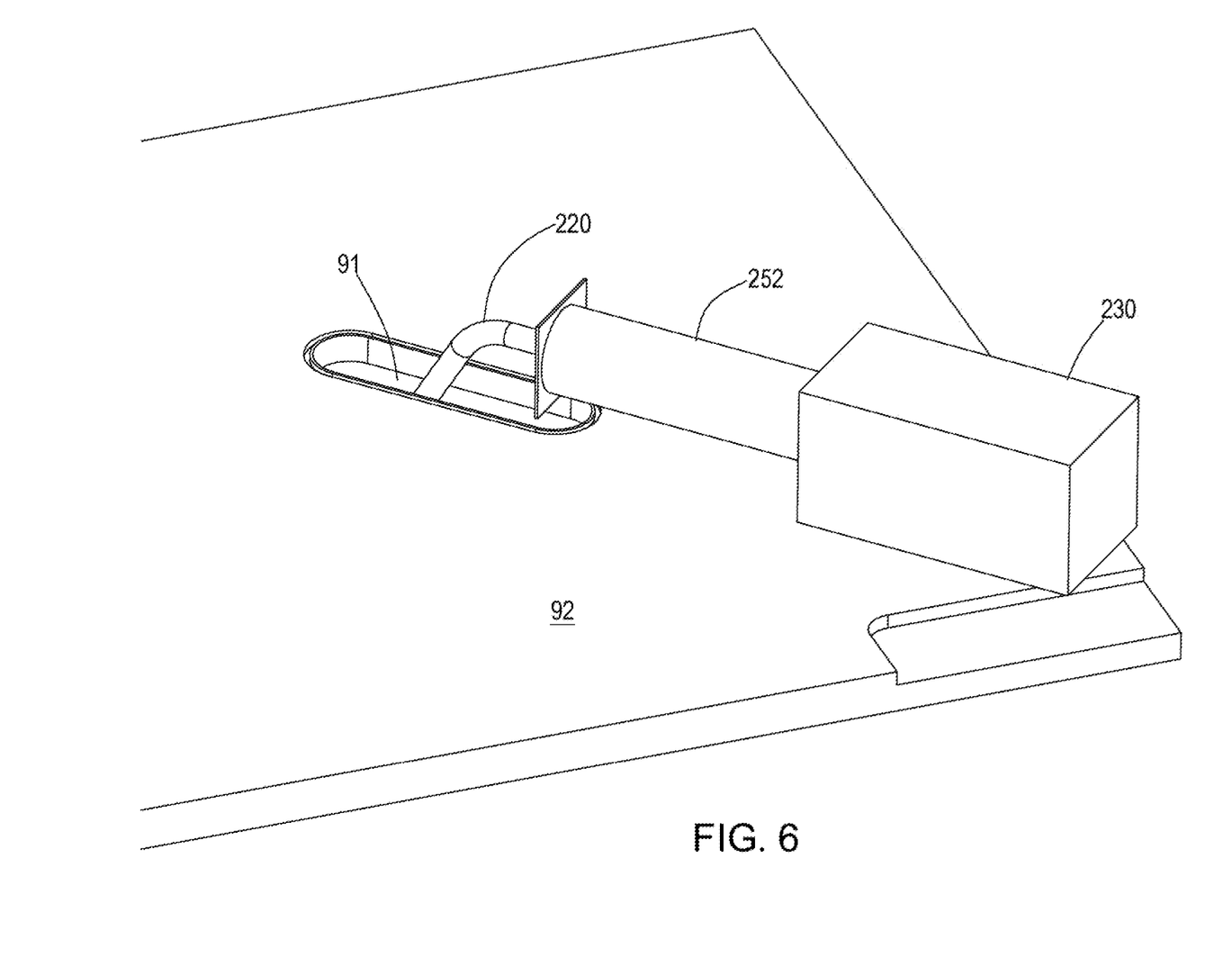
FIG. 6 illustrates a portion of an upper facet of a specimen chamber, an EDX detector amplifier, an EDX detector conduit, bellows, and a specimen chamber opening according to an embodiment of the invention.

FIG. 6 illustrates a portion of the upper facet 92 of specimen chamber, EDX detector amplifier 230, EDX detector conduit 220, bellows 252 and specimen chamber opening 91 according to an embodiment of the invention.

In FIG. 6 the EDX detector 200 is in the first position. Cover 251 is not shown for simplicity of explanation.

Figure 7:
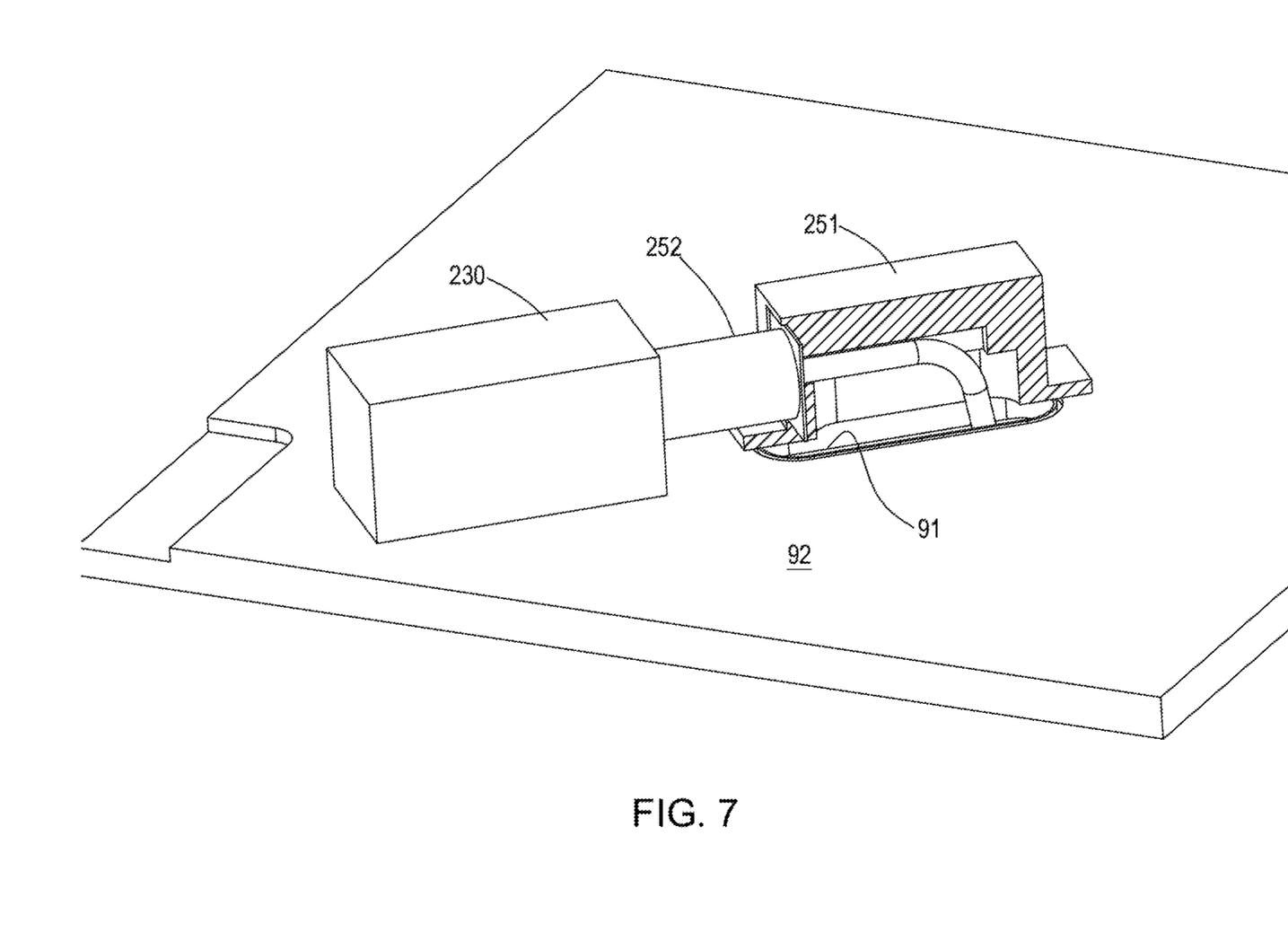
FIG. 7 illustrates a portion of an upper facet of a specimen chamber, an EDX detector amplifier, an EDX detector conduit, a cover, bellows, and a specimen chamber opening according to an embodiment of the invention.

FIG. 7 illustrates a portion of the upper facet 92 of specimen chamber, EDX detector amplifier 230, EDX detector conduit 220, bellows 252, cover 251 and specimen chamber opening 91 according to an embodiment of the invention.

In FIG. 7 the EDX detector 200 is in the first position.

Figure 8:
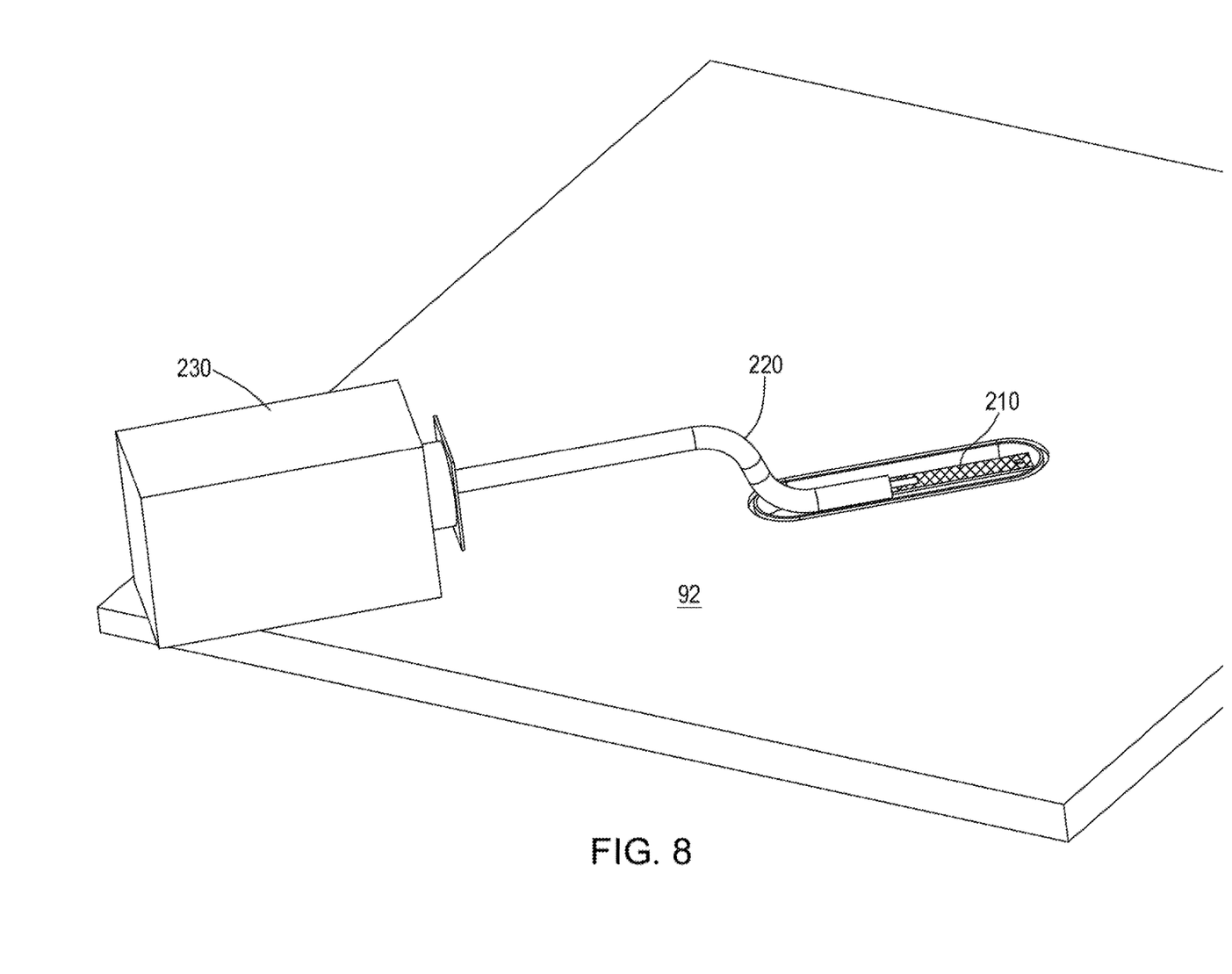
FIG. 8 illustrates a portion of an upper facet of a specimen chamber, an EDX detector amplifier, and EDX detector conduit and an EDX detector tip according to an embodiment of the invention.

FIG. 8 illustrates a portion of an upper facet 92 of specimen chamber, EDX detector amplifier 230, EDX detector conduit 220 and EDX detector tip 210 according to an embodiment of the invention.

In FIG. 8 the EDX detector 200 is in a second position. Cover 251 and bellows 252 are not shown for simplicity of explanation.

Figure 9:
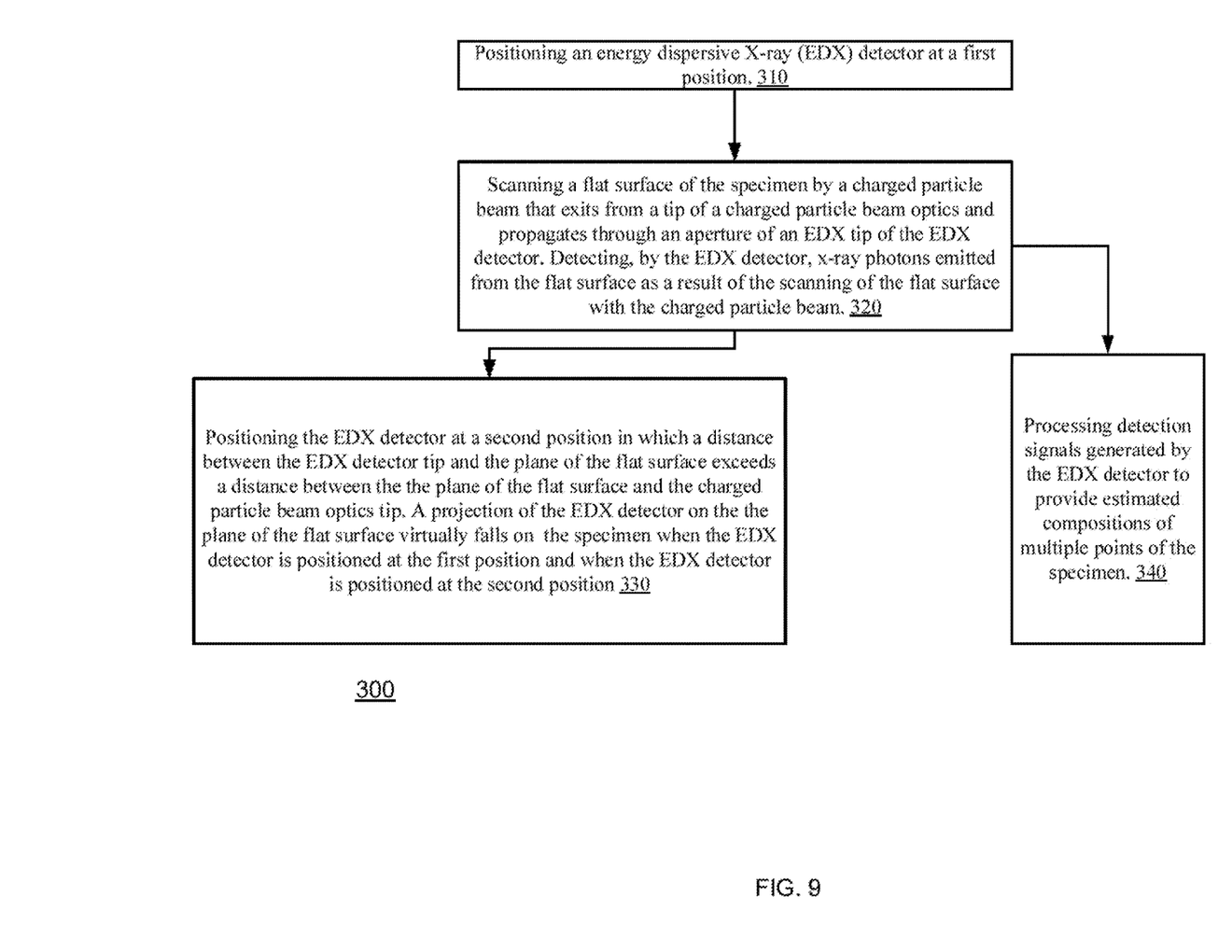
FIG. 9 illustrates a method according to an embodiment of the invention.

FIG. 9 illustrates method 300 according to an embodiment of the invention.

Method 300 can start by step 310 of positioning an energy dispersive X-ray (EDX) detector at a first position.

Step 310 can be followed by step 320 of (i) scanning a flat surface of a specimen by a charged particle beam that exits from a tip of a charged particle beam optics and propagates through an aperture of an EDX tip of the EDX detector; and (ii) detecting, by the EDX detector, x-ray photons emitted from the flat surface as a result of the scanning of the flat surface with the charged particle beam.

Step 320 can be followed by steps 330 and 340.

Step 330 can include positioning the EDX detector at a second position in which a distance between the EDX detector tip and the plane of the flat surface exceeds a distance between the plane of the flat surface and the charged particle beam optics tip.

A projection of the EDX detector on a plane of the flat surface virtually falls on the flat surface when the EDX detector is positioned at the first position and when the EDX detector is positioned at the second position.

Step 340 can include processing detection signals generated by the EDX detector to provide estimated compositions of multiple points of the specimen.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

The connections as discussed herein may be any type of connection suitable to transfer signals from or to the respective nodes, units or devices, for example via intermediate devices. Accordingly, unless implied or stated otherwise, the connections may, for example, be direct connections or indirect connections. The connections may be illustrated or described in reference to being a single connection, a plurality of connections, unidirectional connections, or bidirectional connections. However, different embodiments can vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein may be designed as either negative or positive logic signals. Therefore, in alternate embodiments, those signals described as positive logic signals can be implemented as negative logic signals, and those signals described as negative logic signals can be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments can merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations can be combined into a single operation, a single operation can be distributed in additional operations and operations can be executed at least partially overlapping in time. Moreover, alternative embodiments can include multiple instances of a particular operation, and the order of operations can be altered in various other embodiments.

Also for example, in one embodiment, the illustrated examples can be implemented as circuitry located on a single integrated circuit or within a same device. Alternatively, the examples can be implemented as any number of separate integrated circuits or separate devices interconnected with each other in a suitable manner.

Also for example, the examples, or portions thereof, can implemented as soft or code representations of physical circuitry or of logical representations convertible into physical circuitry, such as in a hardware description language of any appropriate type.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A charged particle beam system, comprising:
a chamber including a top, sidewalls, and a bottom;
a stage disposed within the chamber, the stage configured to support a specimen;
charged particle beam optics having a charged particle beam optics tip configured to output a primary charged particle beam;
a detector comprising a body and a detector tip that includes an aperture, the body of the detector comprising an upper portion disposed above the top of the chamber, a lower portion disposed below the top of the chamber, and an intermediate portion coupled between the upper portion and the lower portion and extending through an opening in the top of the chamber; and
a motion module disposed outside the chamber and configured to move the detector between a first position and a second position;
wherein, when the detector is positioned at the first position, the aperture of the detector tip is aligned with a path of the primary charged particle beam; and
wherein, when the detector is positioned at the second position, the aperture of the detector tip is not aligned with the path of the primary charged particle beam.

2. The system of claim 1 wherein, the upper portion of the body is closer to the top of the chamber when the detector is positioned at the first position than when the detector is positioned at the second position.

3. The system of claim 1 wherein a sensor element is disposed within the detector tip, and the detector tip comprises at least one window disposed between the sensor element and the stage.

4. The system of claim 1 wherein the detector tip comprises multiple windows that are positioned at a radial symmetry around the aperture.

5. The system of claim 1 wherein the motion module is configured to move the detector from the second position to the first position by moving the detector tip downwards away from the top of the chamber and towards the charged particle beam optics tip.

6. The system of claim 1 wherein the opening in the top of the chamber is sealed by a bellows that surrounds a portion of the body of the detector.

7. The system of claim 1 wherein the lower portion of the body of the detector is coupled to the detector tip.

8. The system of claim 1 further comprising an amplifier electrically coupled to a sensor element disposed within the detector tip, the amplifier positioned outside the chamber, and the detector tip positioned inside the specimen chamber.

9. The system of claim 1 wherein a sensor element disposed within the detector tip is configured to detect x-ray photons emitted from the surface of the specimen during scanning.

10. The system of claim 1 wherein a sensor element disposed within the detector tip is configured to detect electrons emitted from the surface of the specimen during scanning.

11. The system of claim 1 further comprising a processor configured to associate points on the surface of the specimen that are illuminated during scanning with detection signals generated by the detector.

12. The system of claim 11 wherein the processor is configured to evaluate compositions of the points on the surface of the specimen that are illuminated during scanning.

13. A method for evaluating a specimen disposed on a stage within a chamber, the method comprising:
positioning a detector at a first position, the detector including a body and a tip, wherein the body comprises an upper portion disposed outside the chamber, a lower portion disposed inside the chamber, and an intermediate portion coupled between the upper portion and the lower portion and extending through an opening in the chamber, and:
scanning, with the detector at the first position, a surface of the specimen using a charged particle beam that exits from a charged particle beam optics tip and propagates through an aperture located at the tip of the detector;
thereafter, positioning the detector at a second position, wherein the upper portion of the body is closer to a top of the chamber when the detector is positioned at the first position than when the detector is positioned at the second position.

14. The method of claim 13 further comprising processing detection signals generated by a sensor element disposed within the detector to provide estimated compositions of the surface of the specimen.

15. The method of claim 13 wherein positioning the detector at the second position comprises moving the tip of the detector along a first direction that is substantially parallel to the surface of the specimen and along a second direction that is substantially perpendicular to the surface of the specimen.

16. The method of claim 13 further comprising detecting, by a sensor element of the detector, x-ray photons emitted from the surface of the specimen during scanning.

17. A charged particle beam system, comprising:
a chamber including a top, sidewalls, and a bottom;
a stage disposed within the chamber, the stage configured to support a specimen;
charged particle beam optics that comprises a charged particle beam optics tip configured to output a primary charged particle beam;
a detector comprising a body and a detector tip that includes an aperture, wherein the body of the detector comprises an upper portion, a lower portion, and an intermediate portion that is coupled between the upper portion and the lower portion; and
a motion module configured to move the detector between a first position and a second position;
wherein, when the detector is positioned at the first position, the detector tip is positioned between the charged particle beam optics tip and the stage; and
wherein, when the detector is positioned at the second position, the upper portion of the body is closer to the top of the chamber than when the detector is positioned at the first position.

18. The system of claim 17 wherein the motion module is configured to move the detector from the second position to the first position by moving the detector tip downwards and towards the charged particle optics tip.

19. The system of claim 17 wherein the intermediate portion of the body extends through an opening in the top of the chamber, and the opening is sealed by a bellows that surrounds a portion of the body of the detector.

20. The system of claim 17 wherein the lower portion of the body is coupled to the detector tip.

* * * * *